(12) United States Patent
Rylyakov et al.

(10) Patent No.: US 7,847,641 B2
(45) Date of Patent: *Dec. 7, 2010

(54) DIGITAL PHASE AND FREQUENCY DETECTOR

(75) Inventors: Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

This patent is subject to a terminal disclaimer.

(21) Appl. No.: 12/142,123

(22) Filed: Jun. 19, 2008

(65) Prior Publication Data

US 2008/0246545 A1 Oct. 9, 2008

Related U.S. Application Data

(63) Continuation of application No. 11/610,900, filed on Dec. 14, 2006, now Pat. No. 7,443,251.

(60) Provisional application No. 60/750,676, filed on Dec. 15, 2005.

(51) Int. Cl.
*H03L 7/065* (2006.01)

(52) U.S. Cl. .................... 331/25; 331/1 A; 331/16; 324/76.52; 324/76.77; 327/2; 327/3; 327/5; 327/7; 327/8; 327/10; 327/12; 327/40; 375/375

(58) Field of Classification Search .......... 331/1 A, 331/16, 25; 327/2, 3, 5, 7, 8, 10, 12, 40; 324/76.52, 76.77; 375/375

See application file for complete search history.

(56) References Cited

U.S. PATENT DOCUMENTS

| | | | | |
|---|---|---|---|---|
| 3,610,954 A | * | 10/1971 | Treadway | 327/12 |
| 5,373,255 A | * | 12/1994 | Bray et al. | 331/1 A |
| 5,963,059 A | * | 10/1999 | Partovi et al. | 327/12 |
| 6,539,316 B1 | * | 3/2003 | Doten et al. | 702/48 |
| 6,771,096 B1 | * | 8/2004 | Meyers et al. | 327/3 |
| 6,919,749 B2 | * | 7/2005 | Alon et al. | 327/277 |
| 6,924,677 B2 | * | 8/2005 | Lee | 327/147 |
| 7,061,276 B2 | | 6/2006 | Xu | |
| 7,215,170 B1 | * | 5/2007 | Kang et al. | 327/218 |
| 2004/0114702 A1 | | 6/2004 | Friedman et al. | |
| 2005/0270893 A1 | | 12/2005 | Lin et al. | |

(Continued)

*Primary Examiner*—Robert Pascal
*Assistant Examiner*—Levi Gannon
(74) *Attorney, Agent, or Firm*—Scully, Scott, Murphy & Presser, P.C.; Anne V. Dougherty, Esq.

(57) ABSTRACT

Disclosed are a digital phase-frequency detector and a method of operating a digital phase-frequency detector. The detector includes an input circuit, an output circuit and a reset circuit. In use, the input circuit receives first and second input signals during a plurality of cycles, and during a given one of the cycles, generates a first intermediate signal or a second intermediate signal depending on which of the first and second input signals was received first during that given one of said cycles. The output circuit receives these intermediate signals, and outputs, during said one cycle, a first output signal or a second output signal depending on which one of intermediate signals was received by the output circuit during said one cycle. The reset circuit applies a reset signal to the input circuit under defined conditions to begin a new one of said plurality of cycles.

33 Claims, 4 Drawing Sheets

U.S. PATENT DOCUMENTS

| | | |
|---|---|---|
| 2006/0146972 A1 | 7/2006 | Wang et al. |
| 2006/0171495 A1 | 8/2006 | Youssouflan |
| 2006/0181353 A1 | 8/2006 | Shigemori |
| 2006/0202726 A1 | 9/2006 | Lin et al. |

\* cited by examiner

SELF-TIMED BANG-BANG PFD

- DETERMINES WHICH FREQUENCY IS HIGHER, OR WHICH PHASE IS EARLIER WHEN FREQUENCIES ARE CLOSE.

- SELF-TIMED CONTROL SIGNAL RESETS THE PFD AFTER THE ARRIVAL ORDER HAS BEEN LATCHED.
- LEAD/LAG INFORMATION IS EXPRESSED AS A LEVEL, RATHER THAN AS A PULSE.

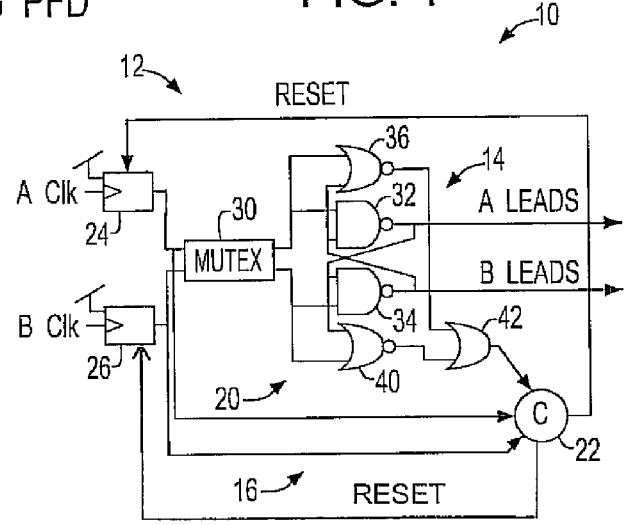

FIG. 1

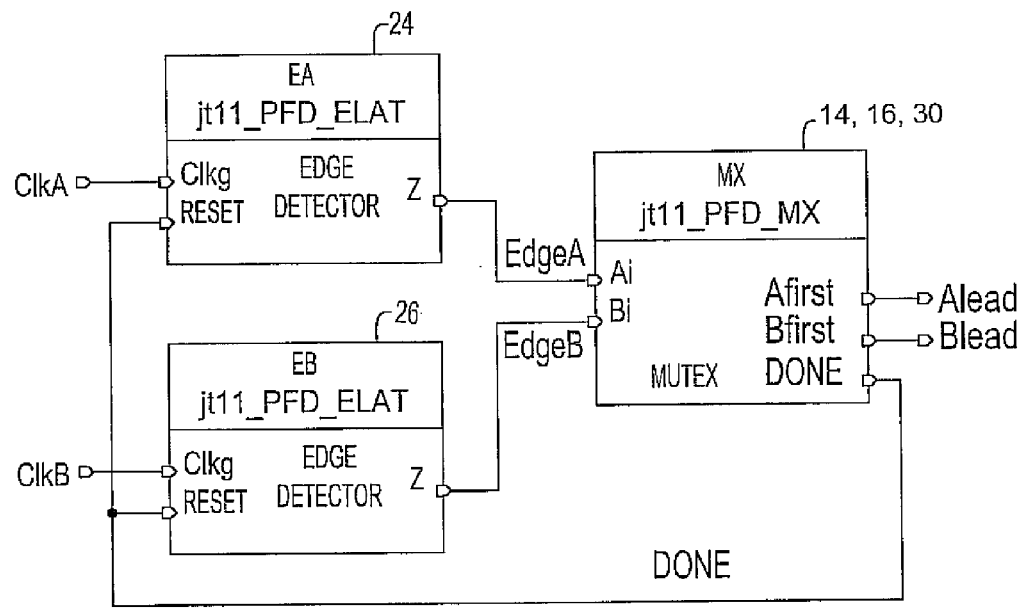

FIG. 2

THE AXIS OF SYMMETRY IS ClkA/ClkB, EdgeA/EdgeB, Alead/Blead

THE FEEDBACK "DONE" WIRE CAN BE LONG (AVOID CAPACITIVE COUPLING TO OTHER NODES TO KEEP IT NOISE-FREE)

DIGITAL PHASE AND FREQUENCY DETECTOR

CROSS REFERENCE TO RELATED APPLICATIONS

This application is a continuation application of U.S. patent application Ser. No. 11/610,900, filed Dec. 14, 2006, now U.S. Pat. No. 7,443,251, issued Oct. 2, 2008, the disclosure of which is herein incorporated by reference in its entirety.

This application claims the benefit of U.S. Provisional Application No. 60/750,676, filed Dec. 15, 2005, for "Apparatus and Method for Providing A Digital Phase Lock Loop," the disclosure of which is hereby incorporated herein by reference.

BACKGROUND OF THE INVENTION

1. Field of the Invention

The present invention generally relates to phase and frequency detectors, and more particularly, to digital phase and frequency detectors. Even more specifically, the invention relates to a digital phase detector that is well suited for use in a digital phase locked loop.

2. Background Art

A phase locked loop is a circuit designed to minimize the phase difference between two signals. When the phase difference approaches zero, or is within a specified tolerance, the phase of the two signals is said to be "locked". Phase locked loops (PLL's) are widely used circuits where it is necessary to have two signals which have a known relationship to one another. For example, when transmitting information from a sending device to a receiving device, it is necessary to have the local clock of the receiving device in sync with the clock of the sending device so that the information can be reliably transmitted. A PLL may be used for that purpose. PLL's have been used for a long period of time, and numerous analog examples of these circuits can be found in the literature and in many devices.

In PLL techniques, a reference clock is generated at the frequency or sub-frequencies of the received data rate, usually using a voltage-controlled oscillator (VCO). A phase detector (PD) circuit compares the phase angle between the VCO clock signal and the received data stream. The phase detector provides a control signal, which is a function of the relative phase between the VCO clock signal, and the received data signal. This control signal is used to adjust the VCO frequency until the clock signal is synchronized with the received data.

PLL's are also used in a variety of devices where the PLL can be constructed of all digital components. The all-digital approach has the benefits of being portable and scalable for other processes and applications. For example, all digital implementations of PLL's are needed for such complex circuits as memory devices. The system clock of certain types of memory devices needs to be in sync with, for example, data so that data may be reliably written to or read from the memory. PLL's are also needed when transferring data within the memory device to insure, for example, that data read out of the memory is properly presented to output pads.

A phase detector is a very important part of a PLL. The phase detector is used to provide phase discrimination and generate a control signal, which is then used to speed up or slow down the local signal so that a desired relationship between the local signal and the reference signal is obtained.

Various approaches to digital phase detectors have been attempted; however, it is believed that these approaches can be improved. For instance, with traditional digital phase detectors, it is difficult to achieve a control signal that accurately indicates the phase difference between the local and reference signals when the loop is close to "lock." Thus, the need exists for a digital phase detector that is suitable, for example, in PLLs and that can reliably produce control signals even when the phase difference between the two signals applied to the detector is very small.

SUMMARY OF THE INVENTION

An object of this invention is to improve digital phase detectors.

Another object of the present invention is to provide a digital phase detector that outputs a digital signal indicating which of two signals was applied first to the detector.

A further object of the invention is to provide a digital phase detector that is well suited for use in a digital phase locked loop.

These and other objectives are attained with a digital phase-frequency detector and a method of operating a digital phase-frequency detector. The detector includes an input circuit, an output circuit and a reset circuit. In use, the input circuit receives first and second input signals during a plurality of cycles and generates a first intermediate signal or a second intermediate signal depending on which of the first and second input signals was received first during a given one of said cycles. The output circuit receives the intermediate signals generated by the input circuit, and outputs, during said one cycle, a first output signal or a second output signal depending on which one of intermediate signals was received by the output circuit during said one cycle. The reset circuit is connected to the input circuit for applying a reset signal to the input circuit under defined conditions to begin a new one of said plurality of cycles.

In the preferred embodiment, the input circuit is adapted to generate (i) the first intermediate signal when, during said one cycle, the first input signal is received before the second input signal, and (ii) the second intermediate signal when, during said one cycle, the second input signal is received before the first input signal. Also, the output circuit is adapted to output (i) the first output signal when the output circuit receives the first intermediate signal, and (ii) the second output signal when the output circuit receives the second intermediate signal.

Further benefits and advantages of this invention will become apparent from a consideration of the following detailed description, given with reference to the accompanying drawings, which specify and show preferred embodiments of the invention.

BRIEF DESCRIPTION OF THE DRAWINGS

FIG. 1 is a diagram of a digital phase-frequency detector (PFD) according to a preferred embodiment of the present invention.

FIG. 2 is a more detailed diagram of the input circuit or portion of the PFD of FIG. 1.

DETAILED DESCRIPTION OF THE PREFERRED EMBODIMENTS

Figure 3:
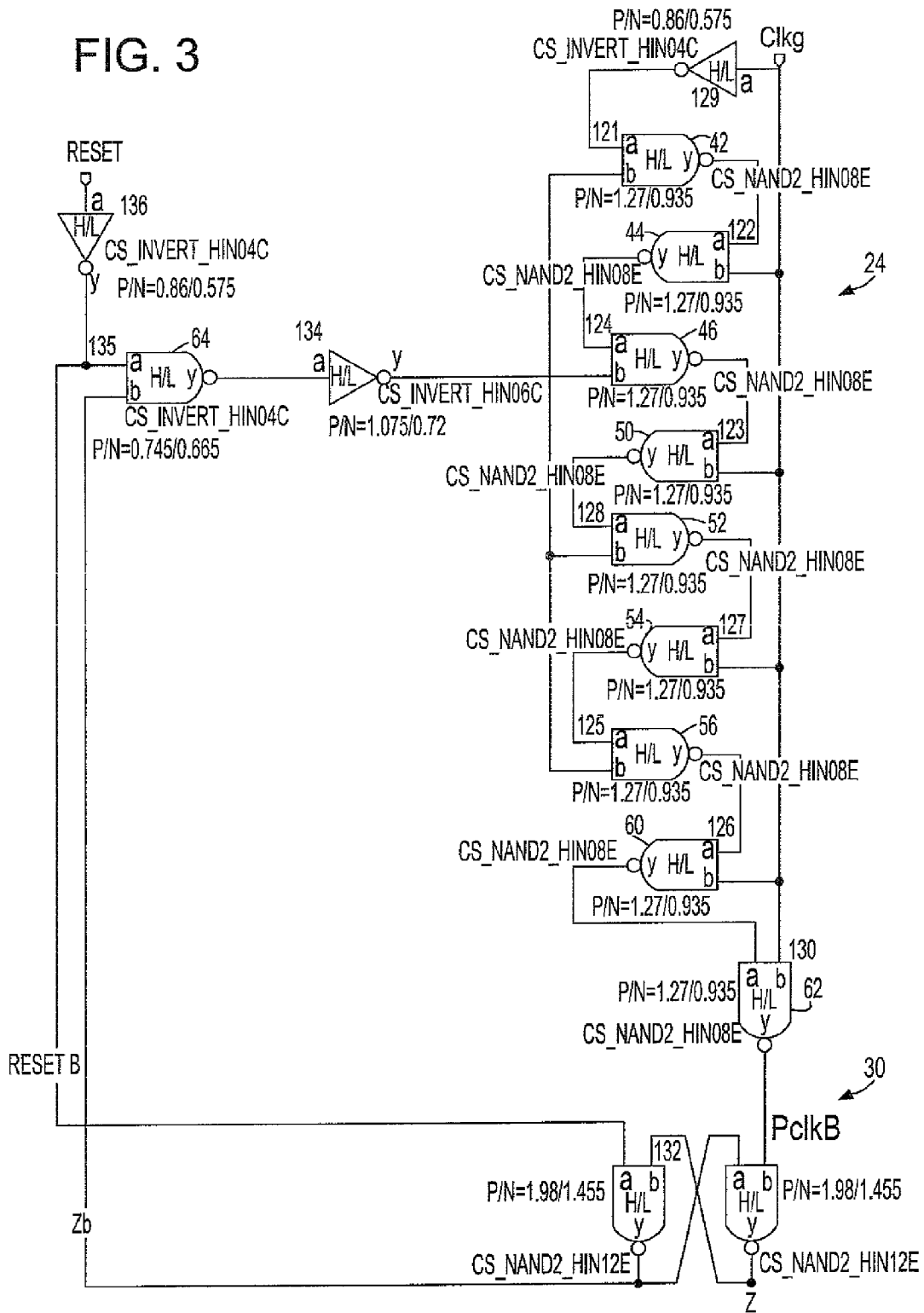
FIG. 3 is a detailed diagram of a latch detector that may be used in the PFD of FIG. 1.

FIG. 1 shows a digital pulse-frequency detector (PFD) 10 embodying the present invention. Generally, detector 10 includes input circuit or portion 12, output circuit or portion 14, and reset circuit or portion 16; and this reset circuit, in turn, includes completion circuit 20 and reset element 22. In the preferred embodiment illustrated in FIG. 1, input circuit 12 includes first or "A" latch 24, second or "B" latch 26 and mutex 30, and output circuit 14 includes NAND gates 32 and 34. Also, in this embodiment of the PFD, completion circuit 30 includes NOR gates 36 and 40 and OR gate 42, and reset element 22 comprises a C element.

Generally, input circuit 12 is provided for receiving first and second input or clock signals, referred to in FIG. 1 as A Clk and B Clk, and for generating a first or a second intermediate signal depending on which one of these input signals was received first during a particular cycle. Output circuit 14 receives the intermediate signals generated by the input circuit and outputs a first or a second signal depending on which one of those intermediate signals was received by the output circuit during a particular cycle. Reset circuit 16 is connected to the input circuit for applying a reset signal to the input circuit under defined conditions to begin a new sensing or timing cycle.

FIG. 2 shows the preferred embodiment of input circuit portion 12 in more detail. As shown in this Figure, each of the latches 24, 26 are an edge latch having two inputs and an output. The clock A signal is applied to latch 24, the clock B signal is applied to latch 26, and the reset signal is applied to both of these latches. In operation, when the designated clock signal is applied to each latch, the output Z of the latch changes from low to high. That output remains high until the reset signal is applied to the latch; and when this happens, the latch output changes from high to low.

Mutex 30, which stands for mutual exclusion element, is provided for determining which of the clock signals A and B is received first in time during a particular cycle, and for generating an output signal indicating which of these clock signals was received first. As shown in FIG. 2, mutex has two inputs A and B and two corresponding outputs, designated as Alead and Blead.

During a particular sensing or timing cycle, when the first one of the two mutex inputs, either A or B, changes from low to high, then (i) the corresponding mutex output is changed from low to high, and (ii) the mutex prevents the other output of the mutex from changing from low to high for the rest of that cycle. More specifically, during a given cycle, if input A goes high before input B, then output Alead goes high; and if input B goes high before input A, then output Blead goes high. Further, once one of the inputs and the corresponding output go high, the mutex then prevents the other output from going high during the cycle.

Any suitable latches may be used in the practice of the present invention, and, for example, FIG. 3 shows an edge latch detector 24 that may be used. The latch shown in FIG. 3 detects a rising edge, and includes a series of NAND gates 42, 44, 56, 50, 52, 54, 56, 60 and 62. The clock signal is applied to the A input of gate 42 and to the B inputs of gates 44, 50, 54 and 60, and the output of each gate is applied to the A input of each successive gate. The output of the last gate 62 is applied to mutex 30. Also, in this arrangement, the reset signal is applied, via gate 64, to the B inputs of alternating gates 42, 46, 52 and 56.

Figure 4:
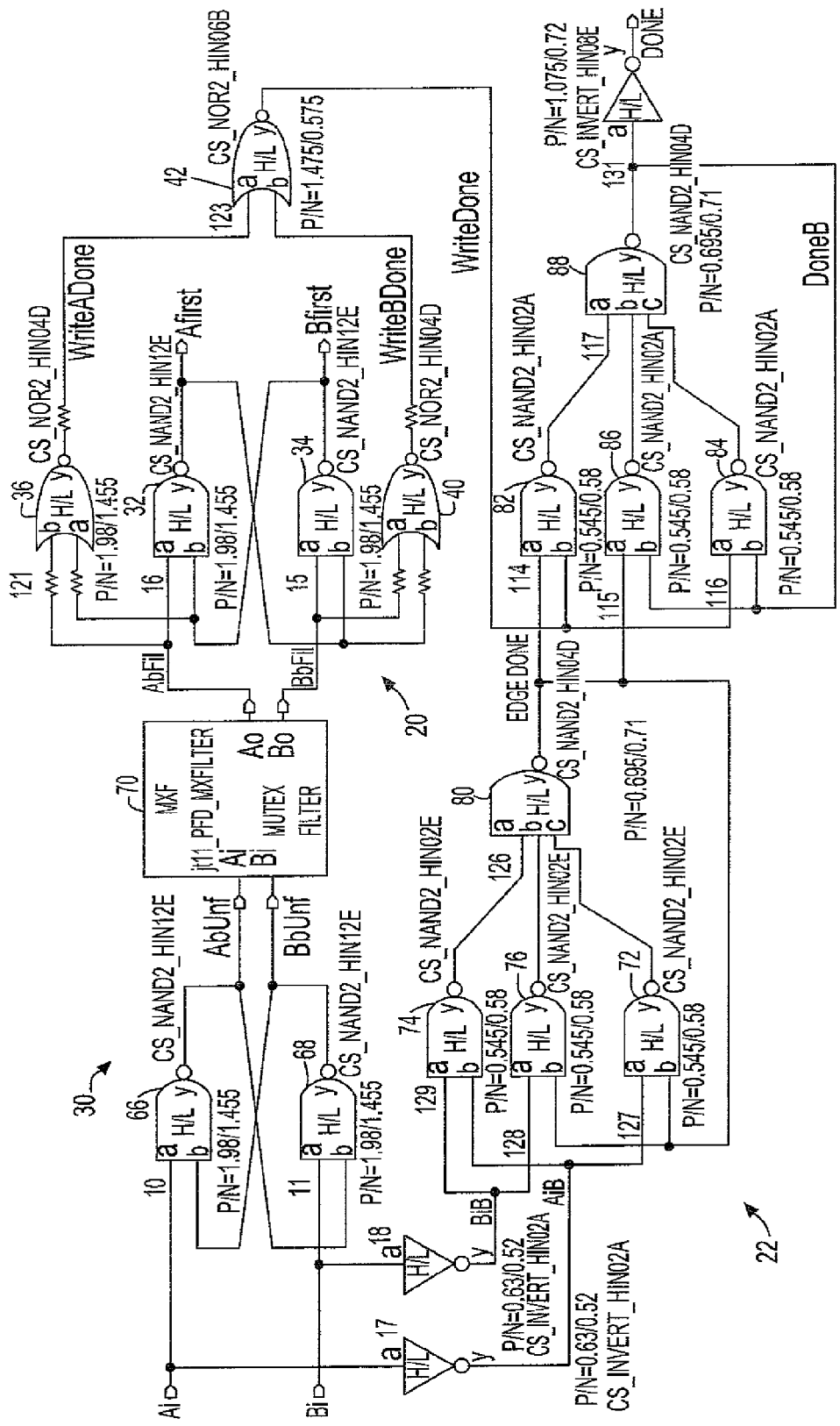
FIG. 4 is a detailed diagram of a portion of the PFD of FIG. 1.

Likewise, any suitable mutex 30 may be employed in the practice of this invention, and FIG. 4 shows one suitable mutex in more detail. As shown in FIG. 4, the mutex includes a pair of NAND gates 66 and 68 and a filter 70. The output from latch A is applied to input A of gate 66 and the output from latch B is applied to input A of gate 68. Also, the output of gate 66 is applied to input B of gate 68 and to input A of filter 70, and the output of gate 68 is applied to input B of gate 66 and to input B of filter 70. Filter 70, in turn, passes the signal at input A to output A, and passes the signal at input B to output B. With this arrangement, when the first of the two latch outputs goes high, that high signal passes through the associated NAND gate and through the mutex filter. In addition, that high signal is applied to the other NAND gate, preventing that other NAND gate from passing any high signal from its associated latch output.

FIG. 3 also shows output circuit 14 in more detail; and with reference to FIGS. 1 and 3, output A of mutex 30 is applied to input A of gate 32, and output B of the mutex is applied to input A of gate 34. The output of gate 32 is applied to input B of gate 34; and, similarly, the output of gate 34 is applied to input B of gate 32. With this design, when mutex output A is high, output Afirst is also high; and when mutex output B is high, output Bfirst is high. These outputs, Afirst and Bfirst, may be used in a write operation, and when one of these outputs goes high, the write operation is considered done.

The reset circuit 16, as mentioned above, is connected to the input circuit 12 for applying a reset signal to the input circuit under defined conditions to start a new sensing or timing cycle, and the reset circuit includes completion circuit 20 and reset element 22. Generally, the completion circuit 20 is connected to both the input circuit 12 and to the output circuit 14. The completion circuit generates a completion signal when, during a particular timing or sensing cycle, (i) the input circuit generates one of the intermediate signals and (ii) the output circuit outputs one of the output signals. The reset element 22 is connected to the completion circuit 20 for receiving the completion signal therefrom, and for generating the reset signal.

The completion circuit 20 and the reset element 22 are shown in detail in FIG. 4. As indicated therein, output A of the mutex filter 70 is applied to input A of gate 36, and output B of the filter 70 is applied to input A of gate. In addition, the output of gate 34 is applied to input B of gate 36, the output of gate 32 is applied to input B of gate 40, and the outputs of both gates 36 and 40 are applied to OR gate 42. With this design, the output of OR gate 42, referred to as the write done signal, is high when two conditions are met: (i) one of the outputs of filter 70 is high, and (ii) one of the outputs of gates 32 and 34 is high. If neither of these conditions is met, then the output of OR gate 42 is low.

Also, as shown in FIG. 4, the output of latch A is applied to the A input of gate 72 and to the B input of gate 74, the output of latch B is applied to input A of gates 74 and 76, and the output of gate 80 is applied to input B of gates 72 and 76. The outputs of gates 74, 76 and 72 are applied to the inputs A, B and C, respectively, of gate 80. The output of gate 80 is also applied to the A inputs of gates 82 and 84, the write done signal is applied to input B of gate 82 and to input A of gate 84, and the output signal of gate 88 is applied to the B inputs of gates 84 and 86. The outputs of gates 82, 86, 84 are applied to the A, B and c inputs of gate 88.

The output of the C element is the reset signal; and with the illustrated design, that output changes when either all the inputs to the C element are high or all the inputs are low. Specifically, the output changes to high when all the inputs are high, and the output changes to low when all the inputs are low. Other changes to the inputs to the C element do not cause any change to the output.

Figure 5:
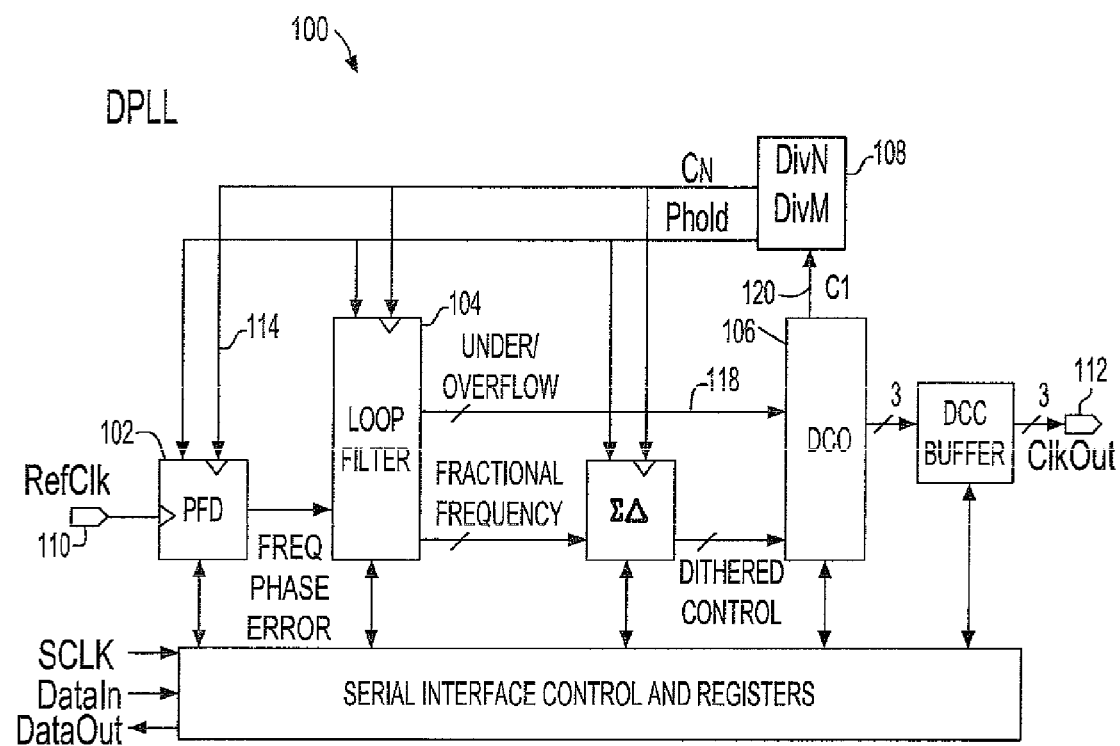
FIG. 5 shows a block diagram of a phase locked loop that includes the PFD of FIG. 1.

FIG. 5 shows a block diagram of an example of a phase locked loop 100 including a digital phase detector 102 in accordance with one embodiment of the present invention. Certain details and features have been left out of FIG. 5 that are understood by a person of ordinary skill in the art. Phase locked loop 100 includes digital phase detector 102, loop filter 104, digitally controlled oscillator 106, and feedback divider 108. Phase locked loop 100 can be an all-digital phase locked loop. In one embodiment, phase locked loop 100 can be a phase locked loop comprising one or more digital components, such as digital phase detector 102. Phase locked loop 100 can be configured to receive reference signal 110 and provide output signal 112, which is phase locked to reference signal 110.

As shown in FIG. 5, reference signal 110, which can be a digital reference signal, is coupled to one input of digital phase detector 102, and a divided oscillator output signal 114, which is outputted by feedback divider 108, is coupled to another input of digital phase detector 102 via line 114. Digital phase detector 102 outputs a digital phase error signal on line 116.

The digital phase error signal outputted by digital phase detector 102 indicates a difference in phase between reference signal 110 and the divided oscillator output signal outputted by feedback divider 108, and is used to control the frequency of digitally controlled oscillator 106.

Also shown in FIG. 1, the output of digital phase detector 102 is coupled to the input of loop filter 104 via line 116. Loop filter 104 can be a digital loop filter, which can be an elliptical filter, and can be configured to receive the digital phase error signal outputted by digital phase detector 102, appropriately filter the digital phase error signal, and provide a digital tuning control signal on line 118. An elliptical filter provides a sharp roll-off, which advantageously increases noise attenuation and allows a wider bandwidth. Also, in contrast to an analog loop filter, a digital loop filter will not vary significantly with process or temperature and has a filter area (on a semiconductor die) that will advantageously scale with technology.

Further shown in FIG. 1, the output of loop filter 104 is coupled to the input of digitally controlled oscillator 106 via line 118. Digitally controlled oscillator 106 can be configured to receive a digital tuning control signal outputted on line 118 by loop filter 104, utilize the digital tuning control signal to appropriately adjust oscillator frequency, and provide output signal 112, which is phase locked to reference signal 110. Also shown in FIG. 1, output signal 112, which is outputted by a digitally controlled oscillator 106, is coupled to the input of feedback divider 108 via line 120. Feedback divider 108 can be configured to receive output signal 112 on line 120, divide output signal 112 by an appropriate integer value in a manner known in the art, and output a divided oscillator feedback signal to digital phase detector 102 on line 114.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A digital phase-frequency detector, comprising:
   an input circuit for receiving first and second input signals during a plurality of cycles and for generating a first intermediate signal or a second intermediate signal depending on which of the first and second input signals was received earlier during a given one of said cycles;
   an output circuit for receiving the intermediate signals generated by the input circuit, and for outputting, during said one cycle, one of a first output signal or a second output signal depending on which one of intermediate signals was received by the output circuit during said one cycle; and
   a reset circuit connected to the input circuit for applying a reset signal to the input circuit under defined conditions to begin a new one of said plurality of cycles, the reset circuit including a completion circuit for generating a cycle completion signal in response to, during said one cycle, the output circuit generating said one of said first or second output signals.

2. A digital phase-frequency detector according to claim 1, wherein:
   the input circuit is adapted to generate (i) the first intermediate signal when, during said one cycle, the first input signal is received before the second input signal, and (ii) the second intermediate signal when, during said one cycle, the second input signal is received before the first input signal; and
   the output circuit is adapted to output (i) the first output signal when the output circuit receives the first intermediate signal, and (ii) the second output signal when the output circuit receives the second intermediate signal.

3. A digital phase-frequency detector according to claim 1, wherein the completion circuit is connected to the input circuit for receiving the intermediate signals generated by the input circuit, and connected to the output circuit for receiving the output signals output by the output circuit.

4. A digital phase-frequency detector according to claim 3, wherein the reset circuit further includes:
   a reset element connected to the completion circuit for receiving the completion signal therefrom, and wherein one of said defined conditions is that the reset element receives said completion signal during said one cycle.

5. A digital phase-frequency detector according to claim 4, wherein the output circuit includes:
   a first gate for receiving the first intermediate signal from the input circuit; and
   a second gate for receiving the second intermediate signal from the input circuit.

6. A digital phase-frequency detector according to claim 5, wherein the first gate is a NAND gate, and the second gate is a NAND gate.

7. A digital phase-frequency detector according to claim 3, wherein the completion circuit includes:
   a first gate for receiving the first intermediate signal from the input circuit; and
   a second gate for receiving the second intermediate signal from the input circuit.

8. A digital phase-frequency detector according to claim 7, wherein the first gate is a NOR gate, and the second gate is a NOR gate.

9. A digital phase-frequency detector according to claim 7, wherein:
   each of the first and second gates has a respective output; and
   the completion circuit further includes a third gate for receiving the outputs from said first and second gates.

10. A digital phase-frequency detector according to claim 9, wherein:
    the first gate is a NOR gate;
    the second gate is a NOR gate; and
    the third gate is an OR gate.

11. A digital phase-frequency detector according to claim 1, wherein the input circuit includes:

a first latch for receiving and latching the first input signal, and for outputting a first latch signal when said first input signal is received; and a second latch for receiving and latching the second input signal and for outputting a second latch signal when the second input signal is received.

12. A digital phase-frequency detector according to claim 11, wherein the reset signal is applied to the first and second latches to reset said latches.

13. A digital phase-frequency detector according to claim 11, wherein the reset circuit is connected to the first and second latches, and one of said defined conditions is that the reset circuit receives the first latch signal and receives the second latch signal during said one cycle.

14. A digital phase-frequency detector, comprising:

an input circuit for receiving first and second input signals during a plurality of cycles and for generating a first intermediate signal or a second intermediate signal depending on which of the first and second input signals was received first during a given one of said cycles;

an output circuit for receiving the intermediate signals generated by the input circuit, and for outputting, during said one cycle, a first output signal or a second output signal depending on which one of intermediate signals was received by the output circuit during said one cycle; and a reset circuit connected to the input circuit for applying a reset signal to the input circuit under defined conditions to begin a new one of said plurality of cycles; and wherein the input circuit further includes:

a first latch for receiving and latching the first input signal, and for outputting a first latch signal when said first input signal is received;

a second latch for receiving and latching the second input signal and for outputting a second latch signal when the second input signal is received; and a mutex for receiving the first and second latch signals, and for generating, during said one cycle, (i) the first intermediate signal when the mutex receives the first latch signal before the second latch signal, and (ii) the second intermediate signal when the mutex receives the second latch signal before the first latch signal.

15. A method of operating a digital phase-frequency detector comprising an input circuit and an output circuit, the method comprising the steps of:

transmitting first and second input signals to the input circuit during a plurality of cycles;

using said input circuit for generating a first intermediate signal or a second intermediate signal depending on which of the first and second input signals was transmitted earlier to the input circuit during a given one of said cycles;

applying the intermediate signals to the output circuit;

using said output circuit for outputting, during said one cycle, one of a first output signal or a second output signal depending on which one of intermediate signals was received by the output circuit during said one cycle; and resetting the input circuit under defined conditions to begin a new one of said plurality of cycles, including generating a cycle completion signal in response to, during said one cycle, output circuit generating said one of said first or second output signals.

16. A method according to claim 15, wherein:

the step of using the input circuit includes the step of using the input circuit to generate (i) the first intermediate signal when, during said one cycle, the first input signal is received before the second input signal, and (ii) the second intermediate signal when, during said one cycle, the second input signal is received before the first input signal; and the step of using the output circuit includes the step of using the output circuit to output (i) the first output signal when the output circuit receives the first intermediate signal, and (ii) the second output signal when the output circuit receives the second intermediate signal.

17. A method according to claim 15, wherein the resetting step includes the step of:

generating the completion signal when, during said one cycle, the input circuit generates one of the intermediate signals, and the output circuit generates one of the output signals.

18. A method according to claim 17, wherein one of said defined conditions is that said completion signal is generated during said one cycle.

19. A method according to claim 18, wherein the input circuit further includes a mutex, and wherein:

the step of using the input circuit further includes the step of using the mutes for receiving the first and second latch signals, and for generating, during said one cycle, (i) the first intermediate signal when the mutex receives the first latch signal before the second latch signal, and (ii) the second intermediate signal when the mutex receives the second latch signal before the first latch signal.

20. A method according to claim 18, wherein the resetting step includes the step of applying a reset signal to the first and second latches to reset said latches.

21. A method according to claim 18, wherein the phase-frequency detector further includes a reset circuit, and wherein:

the resetting step further includes the step of using the reset circuit to generate a reset signal and to apply the reset signal to the input circuit; and one of said defined conditions is that the reset circuit receives the first latch signal and the second latch signal during said one cycle.

22. A method according to claim 21, wherein:

the resetting step includes the further step of applying the reset signal to the first and second latches.

23. A method according to claim 15, wherein the input circuit includes first and second latches, and wherein:

the step of transmitting the first and second input signals to the input circuit includes the steps of transmitting the first input signal to the first latch and transmitting the second input signal to the second latch; and the step of using the input circuit includes the steps of using the first latch for outputting a first latch signal when said first input signal is received; and using the second latch for outputting a second latch signal when the second input signal is received.

24. A phase locked loop comprising:

a digital phase detector, said digital phase detector being configured to receive a reference signal and a divided oscillator feedback signal and to output a digital phase-frequency error signal;

said digital phase detector comprising:

i) an input circuit for receiving first and second input signals during a plurality of cycles and for generating a first intermediate signal or a second intermediate signal depending on which of the first and second input signals was received earlier during a given one of said cycles;

ii) an output circuit for receiving the intermediate signals generated by the input circuit, and for outputting, during said one cycle, one of a first output signal or a second output signal depending on which one of intermediate signals was received by the output circuit during said one cycle; and iii) a reset circuit connected to the input circuit for applying a reset signal to the input circuit under defined conditions to begin a new one of said plurality of cycles, the reset circuit including a completion circuit for generating a cycle completion signal in response to, during said one cycle, the output circuit generating said one of said first or second output signals.

25. A phase locked loop according to claim 24, wherein:
the input circuit is adapted to generate (i) the first intermediate signal when, during said one cycle, the first input signal is received before the second input signal, and (ii) the second intermediate signal when, during said one cycle, the second input signal is received before the first input signal; and
the output circuit is adapted to output (i) the first output signal when the output circuit receives the first intermediate signal, and (ii) the second output signal when the output circuit receives the second intermediate signal.

26. A phase locked loop according to claim 24, wherein the reset circuit includes:
the completion circuit is connected to the input circuit for receiving the intermediate signals generated by the input circuit, and connected to the output circuit for receiving the output signals output by the output circuit.

27. A phase locked loop according to claim 26, wherein the reset circuit further includes:
a reset element connected to the completion circuit for receiving the completion signal therefrom, and wherein one of said defined conditions is that the reset element receives said completion signal during said one cycle.

28. A phase locked loop according to claim 26, wherein the output circuit includes:
a first gate for receiving the first intermediate signal from the input circuit; and
a second gate for receiving the second intermediate signal from the input circuit.

29. A method of operating a phase locked loop, said phase locked loop comprising a digital phase detector configured to receive a reference signal and a divided oscillator feedback signal and to output a digital phase-frequency error signal, the method comprising the steps of:
transmitting first and second input signals to an input circuit of the digital phase detector during a plurality of cycles;
using said input circuit for generating a first intermediate signal or a second intermediate signal depending on which of the first and second input signals was transmitted earlier to the input circuit during a given one of said cycles;
applying the intermediate signals to an output circuit of the phase detector;
using said output circuit for outputting, during said one cycle, one of a first output signal or a second output signal depending on which one of intermediate signals was received by the output circuit during said one cycle; and
resetting the input circuit of the phase detector under defined conditions to begin a new one of said plurality of cycles, including generating a cycle completion signal in response to, during said one cycle, the output circuit generating said one of said first and second output signals.

30. A method according to claim 29, wherein:
the step of using the input circuit includes the step of using the input circuit to generate (i) the first intermediate signal when, during said one cycle, the first input signal is received before the second input signal, and (ii) the second intermediate signal when, during said one cycle, the second input signal is received before the first input signal; and
the step of using the output circuit includes the step of using the output circuit to output (i) the first output signal when the output circuit receives the first intermediate signal, and (ii) the second output signal when the output circuit receives the second intermediate signal.

31. A method according to claim 29, wherein the resetting step includes the step of:
generating the completion signal when, during said one cycle, the input circuit generates one of the intermediate signals, and the output circuit generates one of the output signals.

32. A method according to claim 31, wherein one of said defined conditions is that said completion signal is generated during said one cycle.

33. A method according to claim 32, wherein the input circuit includes first and second latches, and wherein:
the step of transmitting the first and second input signals to the input circuit includes the steps of transmitting the first input signal to the first latch and transmitting the second input signal to the second latch; and
the step of using the input circuit includes the steps of using the first latch for outputting a first latch signal when said first input signal is received; and using the second latch for outputting a second latch signal when the second input signal is received.

* * * * *